United States Patent [19] [11] Patent Number: 4,816,766
Zabel et al. [45] Date of Patent: Mar. 28, 1989

[54] SURFACE COIL FOR EXAMINATION USING A NUCLEAR MAGNETIC RESONANCE APPARATUS

[75] Inventors: Hans J. Zabel; Reiner Bader; Walter Lorenz, all of Heidelberg, Fed. Rep. of Germany

[73] Assignee: Siemens Aktiengesellschaft, Berlin and Munich, Fed. Rep. of Germany

[21] Appl. No.: 233,905

[22] Filed: Aug. 17, 1988

Related U.S. Application Data

[63] Continuation of Ser. No. 921,779, Oct. 22, 1986, abandoned.

[30] Foreign Application Priority Data

Nov. 18, 1985 [DE] Fed. Rep. of Germany ....... 3540872

[51] Int. Cl.4 ............................................. G01R 33/20
[52] U.S. Cl. ..................................... 324/318; 128/653
[58] Field of Search ............... 324/318, 322, 307, 309; 128/653

[56] References Cited

U.S. PATENT DOCUMENTS

| | | | |
|---|---|---|---|
| 2,615,134 | 10/1952 | Carter | 343/742 |
| 2,690,509 | 9/1954 | Toth | 343/855 |
| 3,902,177 | 8/1975 | Mori et al. | 343/741 |
| 4,083,006 | 4/1978 | Yokoshima | 343/842 |
| 4,373,163 | 2/1983 | Vendebult | 343/842 |
| 4,452,250 | 6/1984 | Chance et al. | 128/653 |
| 4,595,928 | 6/1986 | Wingard | 343/742 |
| 4,605,899 | 8/1986 | Eumurian et al. | 343/842 |
| 4,691,163 | 9/1987 | Blass et al. | 324/318 |
| 4,714,887 | 12/1987 | Meissner et al. | 324/318 |
| 4,752,738 | 6/1988 | Patrick et al. | 324/318 |

FOREIGN PATENT DOCUMENTS

| | | | |
|---|---|---|---|
| 0419783 | 11/1934 | United Kingdom | 343/842 |
| 0744116 | 1/1956 | United Kingdom | 343/866 |
| WO84/00214 | 6/1982 | World Int. Prop. O. | |
| 8603624 | 12/1984 | World Int. Prop. O. | 343/742 |

Primary Examiner—William L. Sikes
Assistant Examiner—Doris J. Johnson
Attorney, Agent, or Firm—Hill, Van Santen, Steadman & Simpson

[57] ABSTRACT

A surface coil for use in conducting examinations in a nuclear magnetic resonance apparatus is formed by a coaxial conductor section arranged in a loop, the jacket shielding for the coaxial conductor having a gap at a selected location, and the inside conductor and the shielding of a free end of the coaxial conductor section being electrically connected to the shielding of the other end of the coaxial conductor section.

11 Claims, 4 Drawing Sheets

SURFACE COIL FOR EXAMINATION USING A NUCLEAR MAGNETIC RESONANCE APPARATUS

This is a continuation of application Ser. No. 921,779, filed Oct. 22, 1986 abandoned.

BACKGROUND OF THE INVENTION

1. Field of the Invention

The present invention relates to a surface coil of the type used for inducing and acquiring nuclear magnetic resonance signals in an examination subject.

2. Description of the Prior Art

During Examination in a nuclear magnetic resonance apparatus, an examination subject is situated in a uniform fundamental magnetic field. A surface coil is positioned in the proximity of the region of the patient to be examined and, by the generation of a radio-frequency pulse in the presence of an alternating magnetic field, nuclear spins of the examination subject are excited. The nuclear magnetic resonance signal emitted in response to such spins is picked up by the surface coil, and is stored in the NMR apparatus.

The use of surface coils in phosphorous spectroscopy are described, for example, in articles appearing in "Journal Of Magnetic Resonance," 60, pages 268–279 (1984) and "Journal Of Magnetic Resonance," 55, pages 164–169 (1983).

With surface coils for inducing nuclear spin and receiving the resulting resonance signal, a higher image quality (better signal-to-noise ratio) is achieved, and thus a higher detail discrimination is possible because smaller regions can be examined. Surface coils are known which can be geommetrically adapted to the examination region of interest.

Surface coils are generally used in combination with a tunable resonant circuit. A disadvantage of this arrangement is the accompanying sensitivity to exterior electrical noise and to movement of the examination subject, which leads to phase errors. Other disadvantages of such known systems are the complex manufacture of the electrical matching unit, the relative inflexibility in the use of such a complex system, the unwildiness for application to measurements of the human body, and long measurement preparation time resulting from the tuning operation.

SUMMARY OF THE INVENTION

It is an object of the present invention to provide a simply constructed easily usable surface coil which can be readily adapted to making measurements of the human body and which is resistant to noise radiation.

The above object is achieved in accordance with the principles of the present invention in a surface coil which is formed by a section of a coaxial conductor which is arranged in a loop. The jacket shielding of the conductor has a gap at one location. The inside conductor of the coaxial conductor section and the shielding at a free end thereof are electrically connected to the shielding of the other end of the coaxial conductor section.

This arrangement functions as a loop antenna which, in order to avoid disturbances, is provided with shielding having a gap at a selected location. The coaxial conductor may be flexible, so that the conductor section can be bent into a arbitrarily shaped loop. The electrical feed point to the arrangement by a coaxial feed cable is provided at the point where the shielding interior conductor is attached to the jacket shielding of the coaxial conductor section. The gap in the shielding can be placed at an arbitrary location of the loop, however, a symmetrical positioning of the gap at a location opposite the feed point of the loop improves the transmission and reception characteristics. The width of the gap preferably roughly corresponds to the spacing between the inside conductor and the shielding of the coaxial line.

Matching of the loop antenna to the input of a measuring amplifier connected thereto is by means of $\lambda/2$ transformation via the coaxial feed line. In a perferred embodiment, the loopshaped coaxial conductor section can be formed by the end piece of a coaxial feed line. In this embodiment, matching is achieved by selecting the full length of the line to be of a length $n\lambda/2$. This simple manner of constructing and coupling the antenna is useful when applied to the patient and avoids the use of capacitative matching, which is only approximate at best. An improved image quality and three-dimensional resolution is achieved particularly in the frequency range of the intense fields employed for nuclear magnetic resonance tomographs (greater than one Tesla) and the quality is not influenced by the Faraday effect of the jacket shielding, even given inadequate three-dimensional shielding from external electrical noise sources.

DESCRIPTION OF THE PREFERRED EMBODIMENTS

Figure 1:
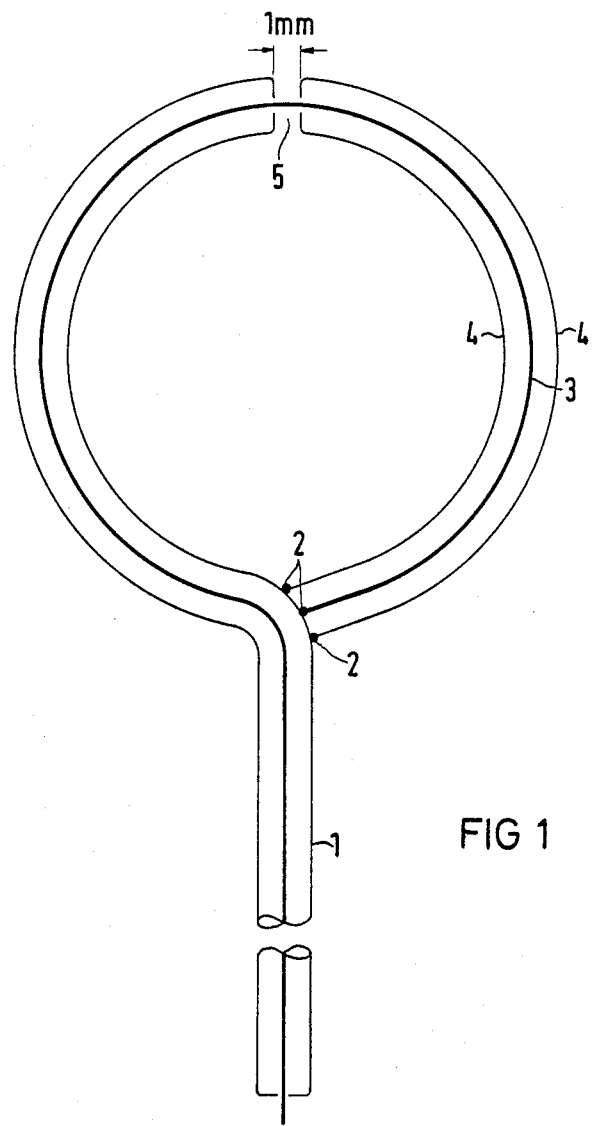
FIG. 1 is a plan view of a surface coil constructed in accordance with the principles of the present invention.

A simple embodiment of a loop antenna constructed in accordance with the principles of the present invention is shown in FIG. 1. An end section of a coaxial feed line 1 having a total length $n\lambda/2$ is bent into a circular loop and, at a free end 2 of this section, both the inside conductor 3 and the jacket shielding 4 are electrically connected to the shielding at the starting point 2 of the loop. The shielding 4 has a gap (approximately 1 mm) at a location 5 disposed opposite the starting point 2 of the loop.

Figure 2:
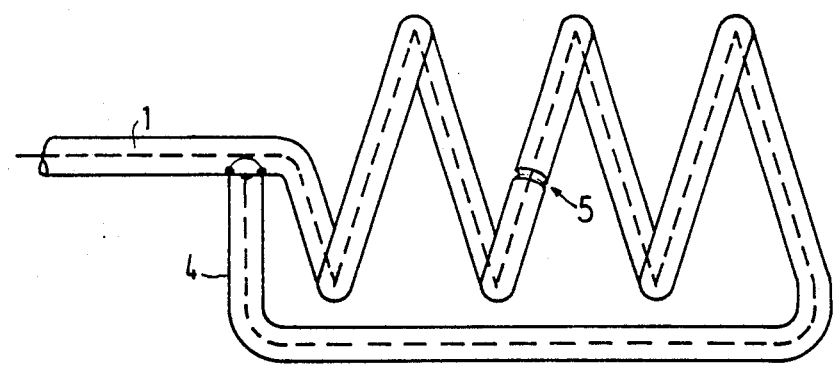
FIG. 2 is a side view of a further embodiment of a surface coil constructed in accordance with the principles of the present invention.

A further embodiment of a coil constructed in accordance with the principles of the present invention is shown in FIG. 2. In this embodiment, the coaxial conductor section forming the surface coil is in the shape of a solenoid having a number of windings, with the free end of the coaxial conductor section forming the loop again being returned to the starting point of the loop. In this embodiment, the gap 5 of the shielding is located at a symmetrical position half-way between the starting point and the end point of the loop. The windings of the solenoid may have different diameters. The illustrated embodiment has the advantage that the radio-frequency feed and the signal acquisition are possible over a larger volume range as a consequence of the improved uniformity.

Figure 3:
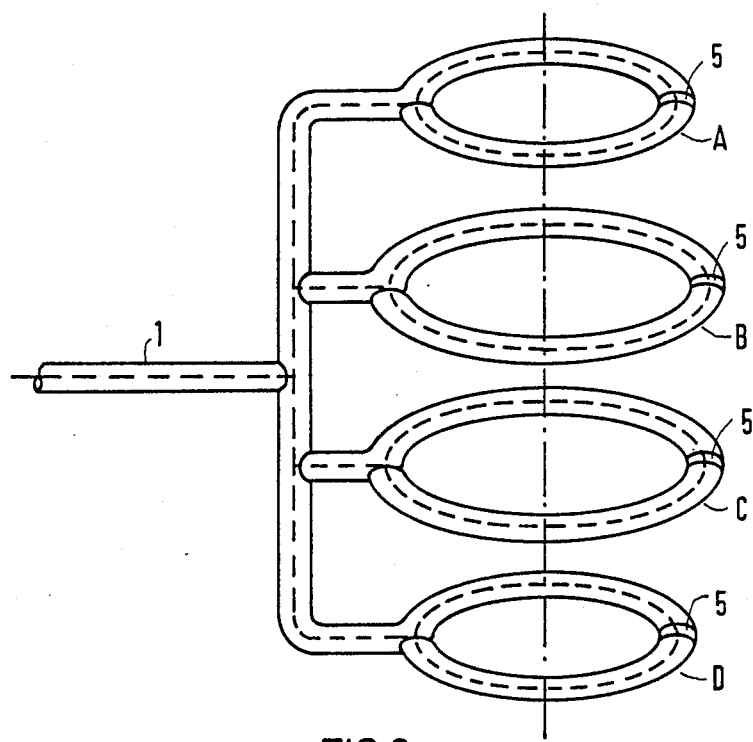
FIG. 3 is a perspective view of an arrangement combining a number of coils of the type shown in FIG. 1.

Another embodiment is shown in FIG. 3, wherein four surface coils A, B, C and D of the type shown in FIG. 1 are disposed parallel to each other in the form of a Helmholtz arrangement. The individual surface coils A through D are connected in parallel to a common feed line 1 such that the respective line lengths are symmetrical with respect to the feed line 1. As in the embodiment of FIG. 1, the gaps 5 of the shieldings 4 are disposed opposite the starting point of the respective loop. Again, radio-frequency excitation and signal acquisition are possible over a greater volume range with this Helmholtz arrangement as a consequence of the improved uniformity.

The low susceptibility to capacitative detuning of the surface coil constructed as a coaxial conductor also enables more complex antenna systems comprising a plurality of surface coils to be provided without problems due to mutual detuning. A flexible matching to the examination subject with an increase in the filling factor thus becomes possible.

The above embodiments make use of linearly polarized RF fields. It is also possible, however, to provide antenna arrangements constructed in accordance with the principles of the present invention having circularly polarized RF fields. Such circularly polarized RF fields generate even more homogeneous RF excitation in the examination subject than do linear fields given lower transmission power.

Figure 4:
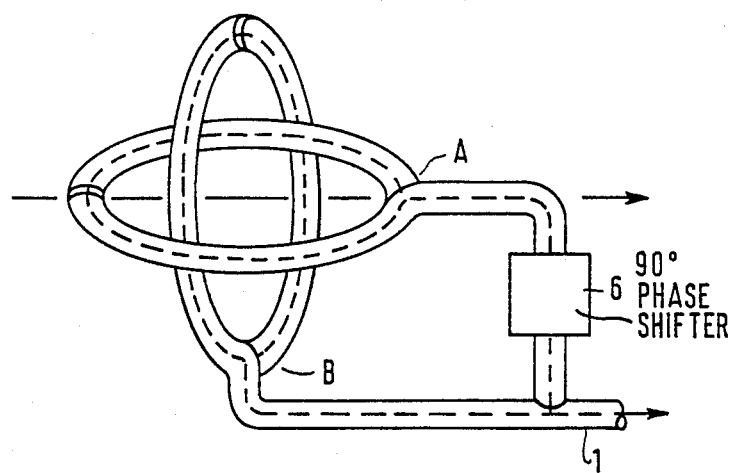
FIG. 4 is a perspective view of another embodiment showing a combination of two coils of the type shown in FIG. 1.

A first embodiment of an arrangement having a circularly polarized RF field is shown in FIG. 4. In this embodiment, two surface coils A and B are disposed orthogonal with respect to each other so as to enclose an examination volume. The surface coil A is connected to the feed line 1 by a 90° phase shifter 6, so that a circularly polarized field arises in the examination volume and can be measured.

Figure 5:
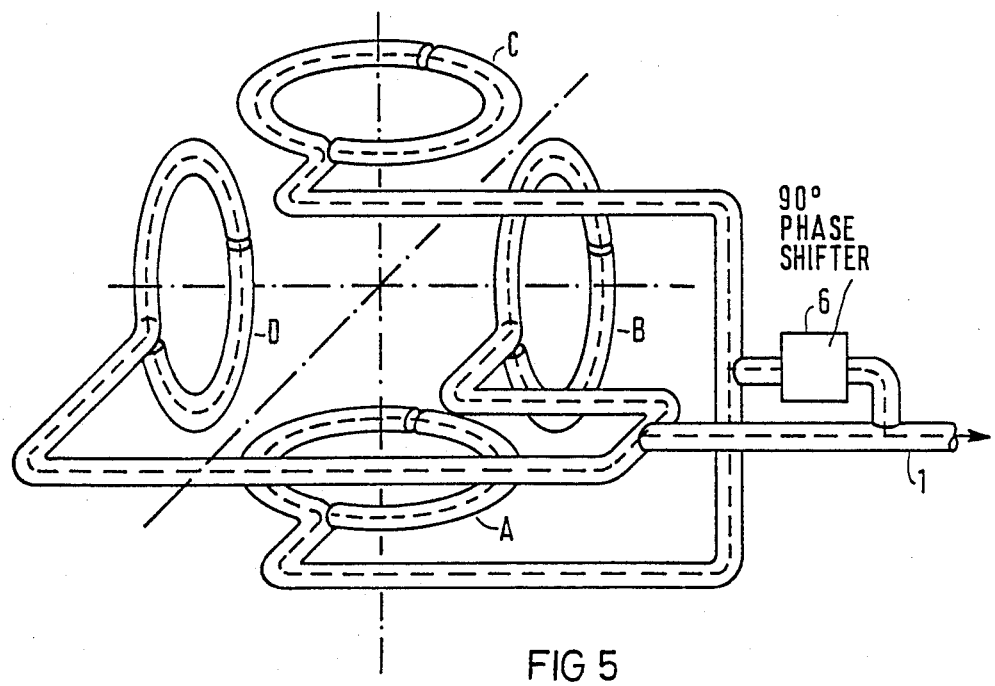
FIG. 5 is a perspective view of another embodiment of an arrangement combining four coils of the type shown in FIG. 1.

A further embodiment for circularly polarized RF fields which enables homogeneous RF excitation in an even greater volume is shown in FIG. 5. In this embodiment, two coil pairs consisting of coils A and C and coils B and D are provided, the respective axes of the coils being perpendicular to each other. The coils of each coil pair are disposed parallel to each other and are connected electrically in parallel. The coil pair B and D is directly connected to the feed line 1, and the coil pair A and C is connected to the feed line 1 through a 90° phase shifter 6. The surface coils A, B, C and D enclose an examination volume which can be filled with a circularly polarized RF field, which can be then measured.

Figure 6:
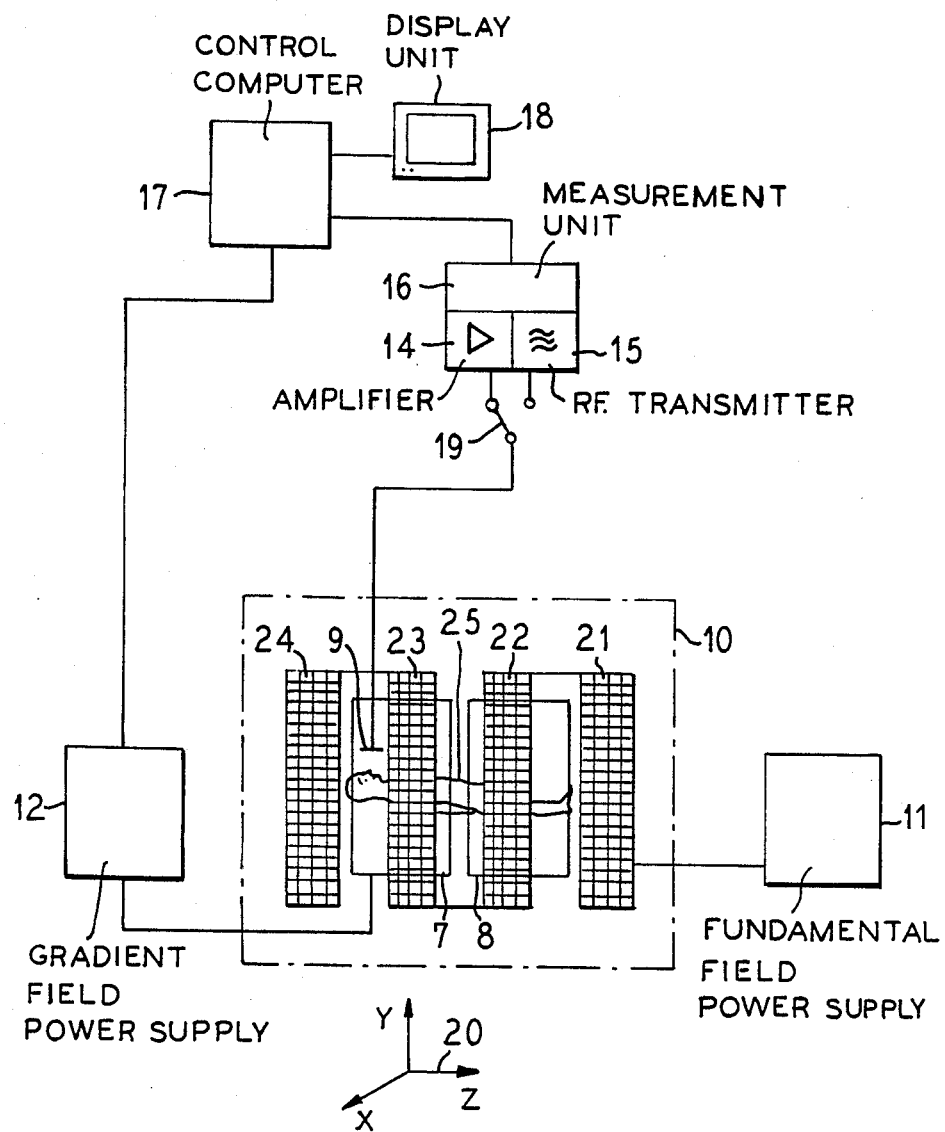
FIG. 6 is a schematic diagram of a nuclear magnetic resonance apparatus embodying a coil arrangement constructed in accordance with the principles of the present invention.

As shown in FIG. 6, a nuclear magnetic resonance examination apparatus in which anyone of the coil arrangements described above can be used, has coils 21, 22, 23 and 24 which generate a fundamental magnetic field in which a patient 25 to be examined is disposed. Gradient coils may also be provided, if needed, for generating independent, mutually perpendicular magnetic field gradients in the x, y and z directions, in accord with the convention referenced at 20. For clarity, only gradient coils 7 and 8 are shown in FIG. 6, which generate the x-gradient together with a pair of identical gradient coils lying opposite thereto (not shown). Identical y-gradient coils (not shown) lie parallel above and below the patient 25, and coils (not shown) for generating the z-gradient field lie at the head and the feet transversely relative to the longitudinal axis of the patient 25. A coil arrangement 9, which may be anyone of the above-described arrangements, is provided to transmit and receive signals to and from the patient 25.

The components in the dot-dash line 10 represent the actual examination instrument. It is operated by an electrical arrangement including a power supply 11 for the coils 21 through 24 and a gradient field power supply 12, to which the gradient coils 7 and 8, as well as the further gradient coils, are connected. The measuring coil arrangement 9 is connected to a process-control computer 17 through either a signal amplifier 14 or an RF transmitter 15. The output of the computer 17 may be displayed on a display unit 18. The components 14 and 15 form a measuring unit 16 for signal generation and registration. A switching element 19 enables switching from the transmit to the receive mode.

Although modifications and changes may be suggested by those skilled in the art it is the intention of the inventors to embody within the patent warranted hereon all changes and modifications as reasonably and properly come within the scope of their contribution to the art.

We claim as our invention:

1. A nuclear magnetic resonance apparatus for examining a subject comprising:
    means for generating a magnetic field in which said subject is disposed;
    means for generating excitation signals to excite nuclear spins in said subject thereby causing nuclear magnetic resonance signals to be generated by said subject;
    surface coil means for transmitting said excitation signals to said subject and receiving said nuclear magnetic resonance signals from said subject, said surface coil means having at least one loop formed by a coaxial conductor section having an interior conductor surrounded by shielding, said section having a starting point and a free end connected to said means for generating excitation signals, the interior conductor and shielding at said free end of said section being electrically connected to the shielding at the starting point of said coaxial conductor section, and said shielding of said coaxial conductor section having a gap at a location within said loop between said starting point and said free end; and
    means connected to said free end of said coaxial conductor section for evaluating said nuclear magnetic resonance signals.

2. A surface coil arrangement as claimed in claim 1, for use with a coaxial feed line for said arrangement, wherein said coaxial conductor section formed in a loop is an end section of said coaxial feed line.

3. A surface coil arrangement as claimed in claim 1, wherein said coaxial conductor section is flexible for bending to match the shape of said examination subject.

4. A surface coil arrangement as claimed in claim 2, wherein said surface coil is matched with a λ/2 transformation with respect to the feed line.

5. A surface coil as claimed in claim 1, wherein said loop is in the shape of a solenoid having a plurality of windings.

6. A surface coil arrangement as claimed in claim 1, comprising a plurality of said loops connected to a common feed line, said loops being disposed geometrically parallel to each other and being electrically connected in parallel to said feed line.

7. A surface coil arrangement as claimed in claim 1, comprising two of said conductor sections respectively formed in a loop, said loops of said conductor sections being disposed orthogonally with respect to each other for generating a circularly polarized RF field, said loops connected to a common feed line with one of said loops being connected to said feed line through a 90° phase shifter.

8. A surface coil arrangement as claimed in claim 1, comprising four of said conductor sections respectively arranged in a loop, said loops being connected in pairs with the loops in each pair being disposed parallel to each other and each pair of loops being disposed perpendicularly with respect to the other pair of loops, said loops being connected to a common feed line with the loops in one of said pairs being connected to said feed line through a 90° phase shifter.

9. A surface coil arrangement as claimed in claim 1, wherein said loop is circular.

10. A nuclear magnetic resonance apparatus for examining a subject comprising:
   means for generating a magnetic field in which said subject is disposed;
   means for generating excitation signals to excite nuclear spins in said subject thereby causing nuclear magnetic resonance signals to be generated by said subject;
   surface coil means for transmitting said excitation signals to said subject and receiving said nuclear magnetic resonance signals from said subject, said surface coil means having a first loop formed by an end section of a first coaxial feed line having an inner conductor and jacket shielding, said first coaxial feed line having a free end connected to said means for generating excitation signals, the inner conductor and said shielding of said free end of said section being electrically connected to said shielding at a starting point of said first loop, and said shielding having a gap therein at a location within said first loop between said starting point and said free end of said section of said first coaxial feed line, a second loop formed by an end section of a second coaxial feed line having an inner conductor and jacket shielding, said inner conductor and said shielding of a free end of said section of said second coaxial feed line being electrically connected to said shielding at a starting point of said second loop, and said shielding of said second feed line having a gap therein at a location within said second loop between said starting point and said free end of said section of said second coaxial feed line, said first and second loops being disposed orthorgonally with respect to each other and said second feed line being electrically connected to said first feed line, and a 90° phase shifter disposed in said second coaxial feed line between said second loop and the connection of said second coaxial feed line to said first coaxial feed line; and
   means connected to said first coaxial feed line for evaluating said nuclear magnetic resonance signals.

11. A nuclear magnetic resonance apparatus for examining a subject comprising:
   means for generating a magnetic field in which said subject is disposed;
   means for generating excitation signals to excite nuclear spins in said subject thereby causing nuclear magnetic resonance signals to be generated by said subject;
   surface coil means for transmitting said excitation signals to said subject and receiving said nuclear magnetic resonance signals from said subject, said surface coil means having a first pair of loops formed by opposite end sections of a first coaxial feed line having an inner conductor and jacket shielding, each end section having a starting point and a free end, with the inner conductor and the shielding of the free ends of said first coaxial feed line sections being respectively electrically connected at the starting points of the respective loops in said first pair of loops, said first feed line having two gaps therein respectively disposed between the starting point and free end of each said loop in said first pair of loops, said loops in said first pair being parallel to each other, a second pair of loops formed by opposite end sections of a second coaxial feed line having an inner conductor and jacket shielding, each end section having a starting point and a free end, with the inner conductor and said shielding of the free ends of said second coaxial feed line being respectively connected at the starting points of the respective loops in said second pair of loops, said second coaxial feed line having two gaps therein respectively disposed between the starting point and free end of each said loop in said second pair of loops, said loops in said second pair of loops being parallel to each other and perpendicular to said loops in said first pair of loops, means connecting said first and second coaxial feed lines to said common feed line, and a 90° phase shifter disposed between said second feed line and said common feed line; and
   means connected to said common feed line for evaluating said nuclear magnetic resonance signals.

* * * * *